United States Patent
Aoki et al.

(10) Patent No.: US 10,904,472 B2
(45) Date of Patent: Jan. 26, 2021

(54) TRANSMISSION SYSTEM

(71) Applicant: Kabushiki Kaisha Toshiba, Minato-ku (JP)

(72) Inventors: Kensuke Aoki, Fuchu (JP); Katsumi Hisano, Matsudo (JP); Tomonao Takamatsu, Kawasaki (JP); Ryosuke Yagi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 937 days.

(21) Appl. No.: 15/066,107

(22) Filed: Mar. 10, 2016

(65) Prior Publication Data

US 2016/0191834 A1    Jun. 30, 2016

Related U.S. Application Data

(63) Continuation of application No. PCT/JP2014/063355, filed on May 20, 2014.

(30) Foreign Application Priority Data

Sep. 11, 2013  (JP) .................................. 2013-188862

(51) Int. Cl.
*H04N 5/38* (2006.01)
*F28D 15/00* (2006.01)
(Continued)

(52) U.S. Cl.
CPC ............... *H04N 5/38* (2013.01); *F28D 15/00* (2013.01); *F28D 20/021* (2013.01);
(Continued)

(58) Field of Classification Search
CPC ......... H04N 5/38; F28D 15/00; F28D 20/021; F28D 2021/0028; H05K 7/20272; H05K 7/20281; H05N 5/38; Y02E 60/14
(Continued)

(56) References Cited

U.S. PATENT DOCUMENTS 3,527,201 A * 9/1970 Epstein .................... F24V 30/00
                                                      126/263.01
4,850,424 A * 7/1989 Mitani ..................... F24H 7/002
                                                      165/10
(Continued)

FOREIGN PATENT DOCUMENTS

CN       102575910 A      7/2012
JP       4-186061         7/1992
(Continued)

OTHER PUBLICATIONS

International Search Report dated Aug. 26, 2014 in PCT/JP2014/063355, filed May 20, 2014 (with English Translation).
(Continued)

*Primary Examiner* — Tho V Duong
*Assistant Examiner* — Raheena R Malik
(74) *Attorney, Agent, or Firm* — Oblon, McClelland, Maier & Neustadt, L.L.P.

(57) ABSTRACT

According to an embodiment, system includes transmitter, pump, controller, tank and thermal storage. Pump circulates water through the transmitter. Controller drives the pump, circulates the water while the transmitter is operating, and stops the circulation of the water at a time of a stop of the transmitter. Tank stores the water circulated through the transmitter, and supplies the water to the pump. Thermal storage is provided on a surface of the tank, and stores waste heat of the exothermic part of the transmitter, which was taken in the water via the tank. Thermal storage changes in phase if a temperature of the water in the tank lowers to a predetermined temperature or below, and heats the water by latent heat which occurs.

4 Claims, 4 Drawing Sheets

(51) Int. Cl.
*F28D 20/02* (2006.01)
*H05K 7/20* (2006.01)
*F28D 21/00* (2006.01)

(52) U.S. Cl.
CPC ..... *H05K 7/20272* (2013.01); *H05K 7/20281* (2013.01); *F28D 2021/0028* (2013.01); *Y02E 60/14* (2013.01)

(58) Field of Classification Search
USPC ........................................ 165/270, 202, 271
See application file for complete search history.

(56) References Cited

U.S. PATENT DOCUMENTS

| | | | | |
|---|---|---|---|---|
| 4,977,953 | A * | 12/1990 | Yamagishi | C09K 5/063 126/263.01 |
| 5,954,119 | A * | 9/1999 | Yamamura | F28D 20/02 126/263.01 |
| 6,744,088 | B1 * | 6/2004 | Dennison | H01L 45/06 257/296 |
| 7,210,522 | B2 * | 5/2007 | Gruian | F01P 3/20 123/41.1 |
| 7,320,357 | B2 * | 1/2008 | Pause | B60H 1/00285 165/104.13 |
| 7,665,513 | B2 * | 2/2010 | Sasaki | F01P 11/08 123/196 AB |
| 7,760,502 | B2 * | 7/2010 | Meyer, III | F28D 15/00 165/80.4 |
| 8,042,609 | B2 * | 10/2011 | Samie | F16H 57/0412 165/202 |
| 8,116,953 | B2 * | 2/2012 | Lopez | F16H 57/0413 180/337 |
| 8,631,772 | B2 * | 1/2014 | Gooden | B60K 11/06 123/196 AB |
| 2004/0019123 | A1 * | 1/2004 | Kwak | C09K 5/063 516/53 |
| 2006/0174643 | A1 * | 8/2006 | Ostrom | F28D 15/00 62/259.2 |
| 2007/0034356 | A1 * | 2/2007 | Kenny | F04B 17/00 165/80.4 |
| 2009/0277603 | A1 * | 11/2009 | Yang | F28D 15/02 165/45 |
| 2010/0218510 | A1 * | 9/2010 | Kim | A23G 9/045 62/3.1 |
| 2012/0168126 | A1 * | 7/2012 | Tanaka | F28D 20/025 165/104.11 |
| 2014/0060794 | A1 * | 3/2014 | Ishii | F28D 20/02 165/201 |
| 2014/0131012 | A1 * | 5/2014 | Yagi | F28D 20/028 165/104.21 |
| 2014/0262126 | A1 * | 9/2014 | Ishii | B60H 1/00492 165/10 |
| 2015/0090422 | A1 * | 4/2015 | Suzuki | C09K 5/10 165/10 |
| 2015/0241136 | A1 * | 8/2015 | Maeda | F28D 20/02 165/10 |
| 2016/0090520 | A1 * | 3/2016 | Suzuki | F28D 20/0034 165/10 |

FOREIGN PATENT DOCUMENTS

| | | | |
|---|---|---|---|
| JP | 11-204151 | | 7/1999 |
| JP | 2010-186821 | | 8/2010 |
| JP | 2010186821 | A * | 8/2010 |
| JP | 2012-174906 | | 9/2012 |

OTHER PUBLICATIONS

Written Opinion dated Aug. 26, 2014 in PCT/JP2014/063355, filed May 20, 2014.
Office Action dated Feb. 17, 2015 in Japanese Patent Application No. 2013-188862 (with English language translation).
Office Action dated Oct. 28, 2014 in Japanese Patent Application No. 2013-188862 (with English language translation).
Combined Chinese Office Action and Search Report dated Dec. 28, 2016 in Chinese Patent Application No. 201480047205.3 (with English translation of category of cited documents).

* cited by examiner

TRANSMISSION SYSTEM

CROSS-REFERENCE TO RELATED APPLICATION

This application is a Continuation Application of PCT Application No. PCT/JP2014/063355, filed May 20, 2014 and based upon and claiming the benefit of priority from prior Japanese Patent Application No. 2013-188862, filed Sep. 11, 2013, the entire contents of all of which are incorporated herein by reference.

FIELD

Embodiments of the present invention relate to a transmission system which transmits, for example, radio waves for television broadcast, by a transmitter of a water-cooling method.

BACKGROUND

Transmission systems for television broadcast are classified into those of a water-cooling method and those of an air-cooling method. The cooling efficiency in the water-cooling method is higher than that in the air-cooling method. Thus, the water-cooling method has such advantages as saving in space and reduction in noise.

A general water-cooling television transmitter system includes a transmitter, a pump rack and a heat exchanger, which are connected by piping. The transmitter and pump rack are installed indoors, and the heat exchanger is installed outdoors. Cooling water circulates through the devices. The cooling water is fed from the pump rack to the transmitter, and cools an exothermic part of the transmitter. Then, the cooling water is cooled by the heat exchanger, and returns to the pump rack.

The circulation of cooling water is in interlock with the operation of the transmitter. Specifically, the cooling water constantly circulates while the transmitter is operating. However, if the transmitter stops, the circulation of cooling water also stops. The water temperature of the cooling water during the operation of the transmitter becomes higher than the temperature of outside air due to the heat produced by the transmitter, but the temperature of the cooling water is kept within a fixed temperature range by the control of the heat exchanger.

At a time of the stop of the transmitter, the cooling water is gradually cooled by ambient air, and the water temperature of the cooling water lowers to a temperature which is equal to the temperature of the ambient air. In an environment (for example, in winter) in which the outdoor temperature is lower than the indoor temperature, the temperature of cooling water at the time of the stop of the transmitter is different between the outdoor piping and the indoor piping, and the water temperature in the outdoor piping becomes lower. If the operation of the transmitter starts from this state, the cold cooling water in the outdoor piping flows into the indoor piping. Thus, depending on conditions such as a temperature difference or humidity, dew condensation occurs on the indoor piping and devices. There is a possibility that a heat shock occurs on board components due to a sharp temperature drop.

This being the case, in the prior art, dew condensation is prevented by controlling temperatures by opening/closing a temperature adjustment valve which is provided on the indoor piping unit. If the water temperature of cooling water is a set value or below at the time of the start of the transmitter, the temperature adjustment valve operates in a manner to circulate the cooling water only within the indoor piping. If the water temperature rises up to the set value, the temperature adjustment valve operates in a manner to mix, little by little, low-temperature cooling water from the outdoor piping into the indoor piping, so that the water temperature may become stable at the set value. If the water temperature falls out of the adjustment range of the temperature adjustment valve, the temperature adjustment valve operates in a manner to cause the cooling water to flow to the outdoor piping side.

In the prior art, a decrease in water temperature at a time of the start of the transmitter is prevented by automatically adjusting the amount of cooling water, which flows from the outdoor piping into the indoor piping, by the temperature adjustment valve. However, if the temperature adjustment valve is installed, the piping system increases, leading to problems such as an increase in size of devices and an increase in cost.

DETAILED DESCRIPTION

Figure 1:
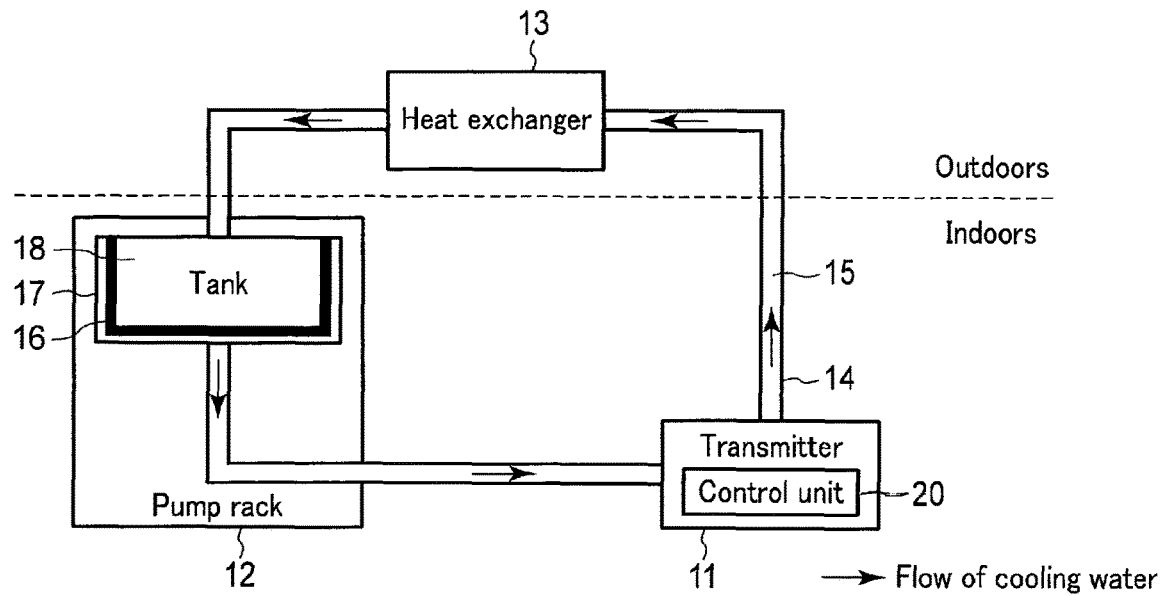
FIG. 1 is a block diagram illustrating an example of a transmission system according to a first embodiment.

In general, according to an embodiment, a transmission system includes a transmitter including an exothermic part which produces heat during an operation. The transmission system further includes a pump unit, a control unit, a tank, and a thermal storage medium. The pump unit circulates cooling water through the transmitter. The control unit drives the pump unit, circulates the cooling water while the transmitter is operating, and stops the circulation of the cooling water at a time of a stop of the transmitter. The tank stores, via external piping, the cooling water which was circulated through the transmitter, and supplies the cooling water to the pump unit. The thermal storage medium is provided on a surface of the tank, and stores waste heat of the exothermic part, which was taken in the cooling water via the tank. The thermal storage medium changes in phase if a temperature of the cooling water in the tank lowers to a predetermined temperature or below, and heats the cooling water in the tank by latent heat which occurs.

Hereinafter, embodiments of a transmission system will be described with reference to the accompanying drawings. In the description below, the same parts in the drawings are denoted by like reference numerals, and an overlapping description is omitted.

First Embodiment

[Configuration]

FIG. 1 is a block diagram illustrating an example of a transmission system according to a first embodiment. This transmission system includes a transmitter 11, a pump rack 12 and a heat exchanger 13. The transmitter 11 and pump rack 12 are installed indoors, and the heat exchanger 13 is installed outdoors.

The transmitter 11, pump rack 12 and heat exchanger 13 are connected by piping 14 which is filled with cooling water 15. In order to prevent flow path blockage and piping breakage due to freezing, an antifreeze fluid, for example, is used for the cooling water 15.

The transmitter 11 includes a control unit 20. The control unit 20 circulates cooling water by the driving of the heat exchanger 13 and by the pump rack 12, while the transmitter 11 is being operated. At the time of the stop of the transmitter 11, the control unit 20 stops the circulation of cooling water by the driving of the heat exchanger 13 and by the pump rack 12.

A tank 18, which stores cooling water that is supplied from outdoor piping, is provided within the pump rack 12. A thermal storage medium 16 is attached to the surface of the tank 18. A heat insulator 17 is attached to the surface of the thermal storage medium 16.

The thermal storage medium 16 is formed of a material which radiates latent heat in accordance with a solid-liquid phase change. As this kind of material, use can be made of, for instance, an inorganic hydrate-based thermal storage medium (sodium acetate hydrate, sodium sulfate hydrate), or an organic substance-based thermal storage medium such as paraffin.

[Operation]

If the transmitter 1 is operated, the cooling water 15 begins to circulate. The cooling water 15 is fed from the pump rack 12, cools an exothermic part of the transmitter 11, is fed to the heat exchanger 13, is cooled by the heat exchanger 13, and returns to the tank 18 of the pump rack 12. The temperature of the cooling water 15 during the operation of the transmitter 11 becomes higher than the outside air temperature due to the heat produced by the transmitter 11, but the temperature of the cooling water 15 is kept within a fixed range by the control of the heat exchanger 13.

The thermal storage medium 16 recovers, via the tank 18, the heat produced from the transmitter 11, which was taken in the cooling water 15. The thermal storage medium 16 changes from a solid to a liquid at a preset melting point, and stores the produced heat of the transmitter 11 as latent heat.

The circulation of the cooling water 15 is in interlock with the operation/stop of the transmitter 11. Specifically, the cooling water 15 constantly circulates while the transmitter 11 is operating. However, if the transmitter 11 stops, the circulation of the cooling water 15 also stops. At a time of the stop of the transmitter, the cooling water is gradually cooled by ambient air, and the water temperature of the cooling water 15 lowers to a temperature which is equal to the temperature of the ambient air. In an environment in which the outdoor temperature is lower than the indoor temperature, a temperature difference in cooling water occurs between the outdoors and indoors at the time of the stop of the transmitter, and the water temperature in the outdoors becomes lower. The thermal storage medium 16 keeps latent heat by a supercooling state.

If the transmitter 11 stops, the thermal storage medium 16 is cooled by ambient air, and the temperature of the thermal storage medium 16 gradually lowers. If the temperature of the thermal storage medium 16 lowers to the melting point, the thermal storage medium 16 is released from the supercooling state, and radiates the latent heat while changing in phase from a liquid to a solid. The latent heat radiated from the thermal storage medium 16 keeps the temperature of the cooling water 15 via the tank 18 and prevents a decrease in temperature of the cooling water in the tank.

If the transmitter 11 is activated, the cooling water 15 starts to circulate. The cooling water of the outdoor piping flows into the indoor piping at low temperatures due to the outside air temperature of the outdoors. However, the cooling water of the outdoor piping mixes with the cooling water in the tank which is heat-retained by the thermal storage medium 16, and thereby the decrease in water temperature is relaxed. Thereby, the occurrence of dew condensation and the occurrence of a heat shock can be suppressed.

Figure 2:
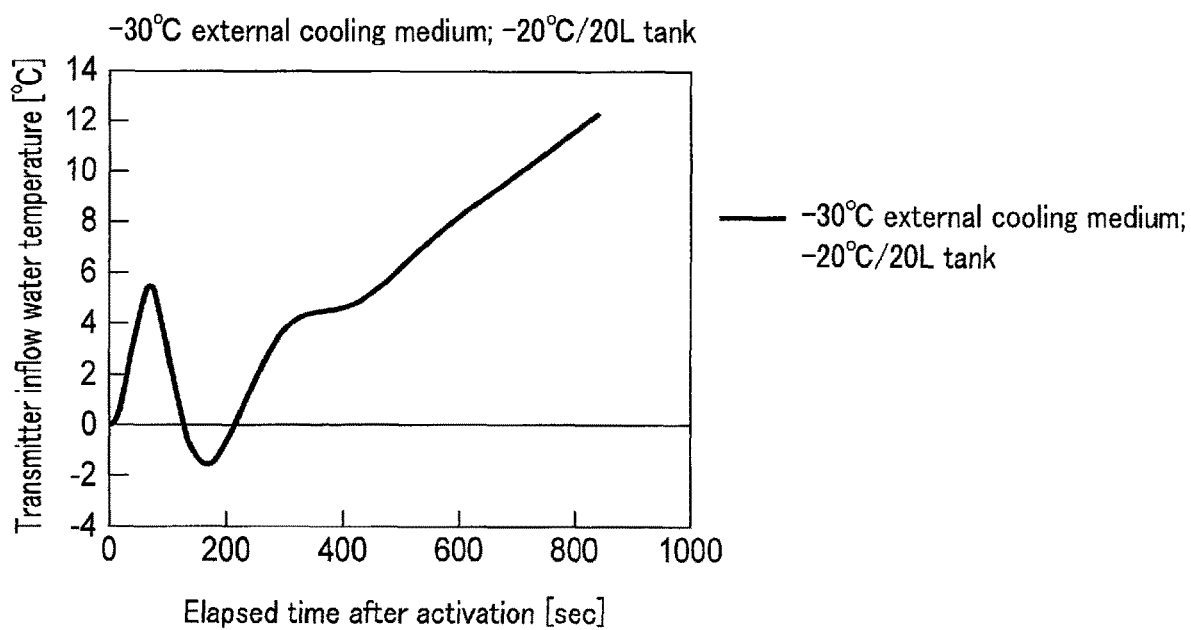
FIG. 2 is a graph illustrating an example of a simulation result of the variation in water temperature in relation to time.
Figure 3:
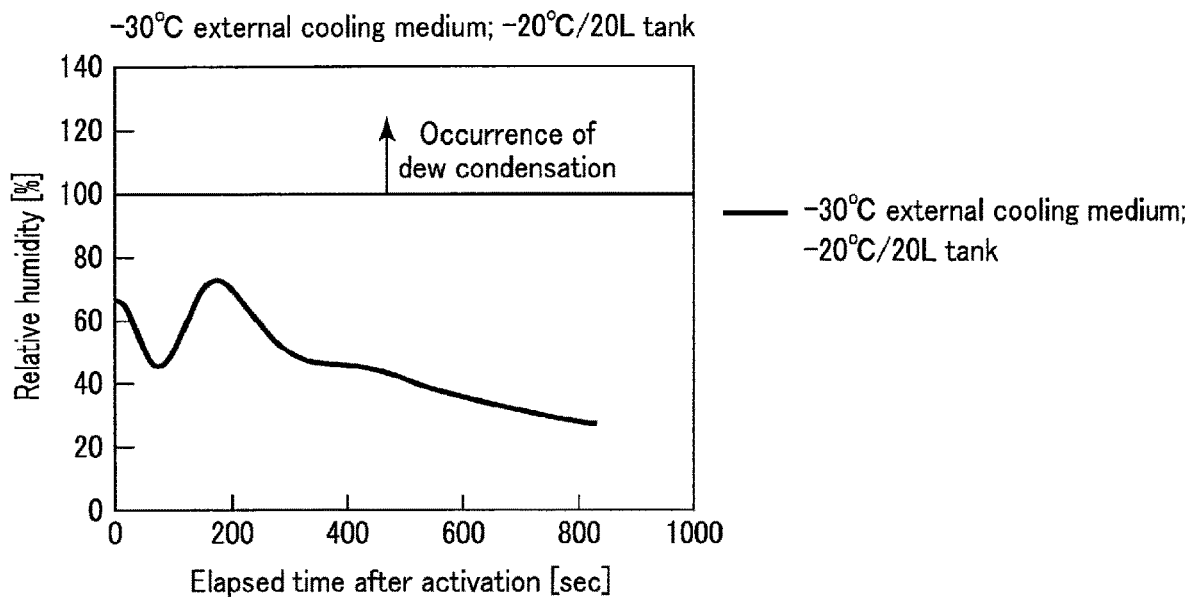
FIG. 3 is a graph illustrating an example of a simulation result of the variation in relative humidity in relation to time.

FIG. 2 is a graph illustrating an example of a simulation result of the variation in water temperature in relation to time. The abscissa of the graph of FIG. 2 indicates an elapsed time from the start of the transmitter. FIG. 3 is a graph illustrating an example of a simulation result of the variation in relative humidity in relation to time. The abscissa of the graph of FIG. 3 also indicates an elapsed time from the start of the transmitter.

In FIG. 2 and FIG. 3, it is assumed that, at the time of the start of the transmitter 11, the water temperature in the tank with a capacity of 20 liters is 20° C. (heat-retained by the thermal storage medium), and cooling water of outdoor piping at −30° C. has flowed in. According to FIG. 2, at the time of the start of the transmitter, the temperature of the cooling water flowing into the transmitter once rises since cooling water in the tank, which is heat-retained by the thermal storage medium, flows in. Then, even when the cooling water of the outdoor piping at −30° C. flows in, this cooling water mixes with the cooling water in the tank, and it is thus understood that the decrease in temperature of the cooling water stops at about −2° C.

In the simulation corresponding to the graph of FIG. 3, the relative humidity does not rise to 100% or more, which is the condition of the occurrence of dew condensation. It is understood, therefore, that dew condensation can be suppressed. So there can be provided a transmission system which is space-saving and inexpensive, and can prevent a decrease in water temperature at a time of the start of a transmitter.

Second Embodiment

[Configuration]

Figure 4:
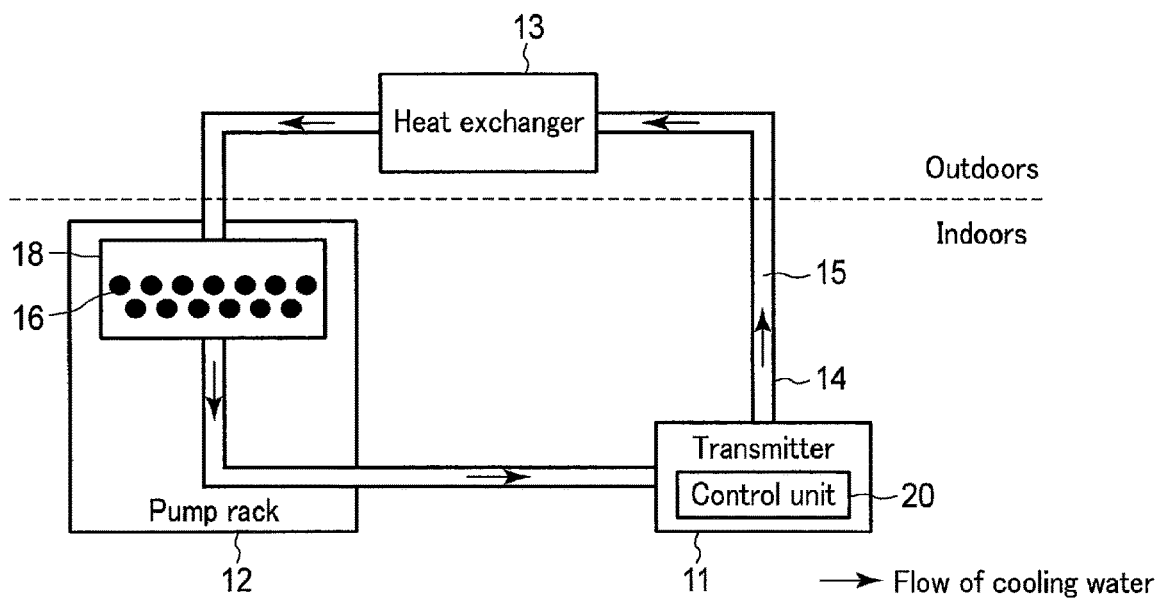
FIG. 4 is a block diagram illustrating an example of a transmission system according to a second embodiment.
Figure 5:
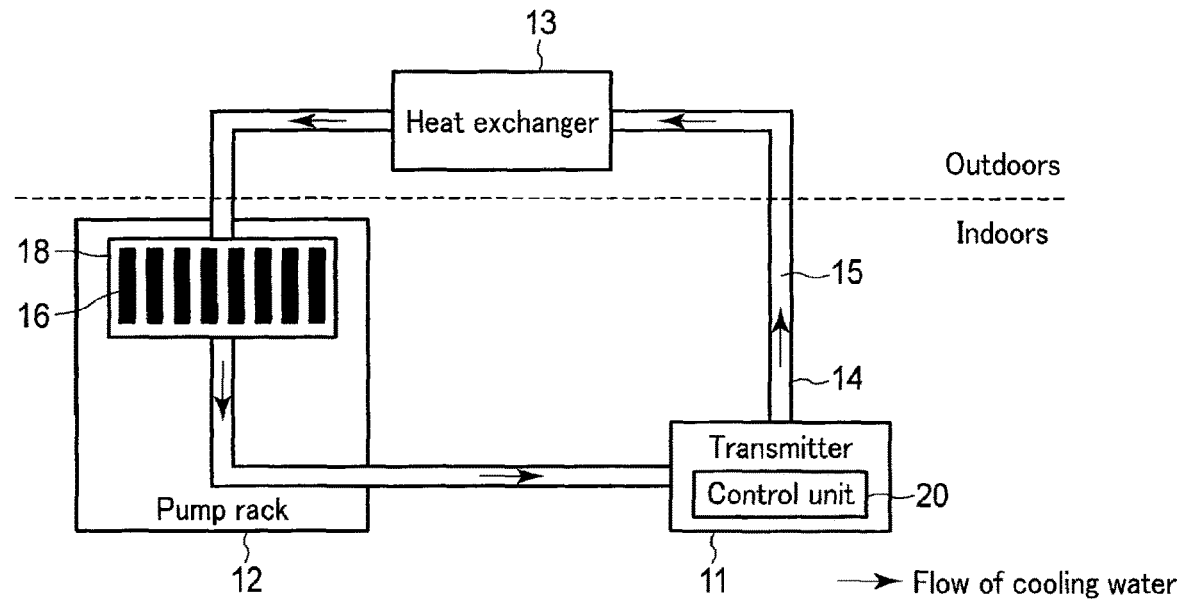
FIG. 5 is a block diagram illustrating the example of the transmission system according to the second embodiment.

FIG. 4 and FIG. 5 illustrate an example of a transmission system according to a second embodiment. In these Figures, a different point from FIG. 1 is that the thermal storage medium 16 is accommodated within the tank 18. The thermal storage medium 16 can be contained in containers in ball shapes, for example, as illustrated in FIG. 4. Alternatively, as illustrated in FIG. 5, the thermal storage medium 16 can be contained in containers in sheet shapes.

[Operation]

The transmitter 11, pump rack 12, heat exchanger 13, piping 14 and cooling water 15 operate in the same manner as in the first embodiment. The thermal storage medium 16 is in direct contact with the cooling water stored in the tank 18, and recovers the heat of the transmitter 11, which was taken in the cooling water 15. Like the first embodiment, the thermal storage medium 16 changes from a solid to a liquid at a preset melting point, and stores the produced heat of the transmitter 11 as latent heat.

After the stop of the transmitter 11, if the transmitter 11 is reactivated from the state in which a temperature difference in cooling water occurs between the outdoors and indoors, the low-temperature cooling water 15 flows from the outdoor piping into the tank 18. If the temperature of the thermal storage medium 16 lowers to the melting point by the cooling water 15 that has flowed in, the thermal storage medium 16 is released from the supercooling state, and radiates the latent heat while changing in phase from a liquid to a solid. The latent heat radiated from the thermal storage medium 16 keeps the temperature of the cooling water 15 and prevents a decrease in temperature of the cooling water in the tank 18. The cooling water 15 of the outdoor piping flows into the indoor piping at low temperatures due to the outside air temperature of the outdoors. However, the cooling water of the outdoor piping 15 mixes with the cooling water which is heat-retained by the thermal storage medium 16 in the tank 18, and thereby the decrease in water temperature is relaxed. Thereby, the occurrence of dew condensation and the occurrence of a heat shock can be suppressed.

Third Embodiment

[Configuration]

Figure 6:
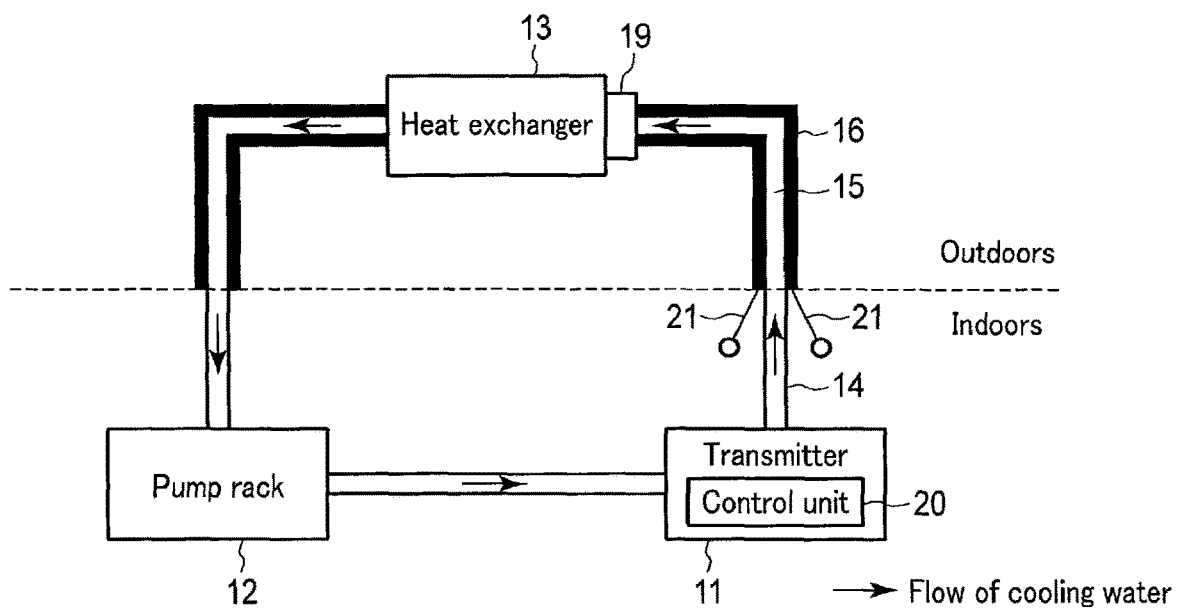
FIG. 6 is a block diagram illustrating an example of a transmission system according to a third embodiment.

FIG. 6 is a block diagram illustrating an example of a transmission system according to a third embodiment. Different points from FIG. 1 are that the tank 18 is removed, and that the thermal storage medium 16 is attached to the surface of the outdoor piping 14. The thermal storage medium 16 includes a pair of electrodes 21. The control unit 20 can apply a voltage to the thermal storage medium 16 via the electrodes 21.

[Operation]

The transmitter 11, pump rack 12, heat exchanger 13, piping 14 and cooling water 15 operate in the same manner as in the first embodiment. The thermal storage medium 16, which is attached to the outdoor piping 14, recovers, via the piping 14, the heat of the transmitter 11 which was taken in the cooling water 15. The thermal storage medium 16 changes from a solid to a liquid at a preset melting point, and stores the produced heat of the transmitter 11 as latent heat.

The control unit 20 applies a voltage to the thermal storage medium 16 in the state in which the transmitter 11 stops and the thermal storage medium 16 stores heat. Then, the thermal storage medium 16 is released from the supercooling state, and radiates the latent heat while changing in phase from a liquid to a solid.

The latent heat radiated from the thermal storage medium 16 heats the cooling water 15 via the piping 14. Thereby, the outdoor cooling water temperature becomes equal to the indoor cooling water temperature. If the transmitter 11 is reactivated from this state, the cooling water 15 begins to circulate. At this time, since the outdoor cooling water is in the state in which it is heated by the thermal storage medium 16, the occurrence of dew condensation and the occurrence of a heat shock can be suppressed.

In the meantime, in the third embodiment, at the time of the start of the transmitter, a voltage is applied to the thermal storage medium 16. Aside from this, a temperature sensor 19, which measures the water temperature of the cooling water 15, may be provided on the outdoor piping 14, and a voltage may be applied if the temperature of the outdoor cooling water is a set water temperature or below.

Fourth Embodiment

[Configuration]

Figure 7:
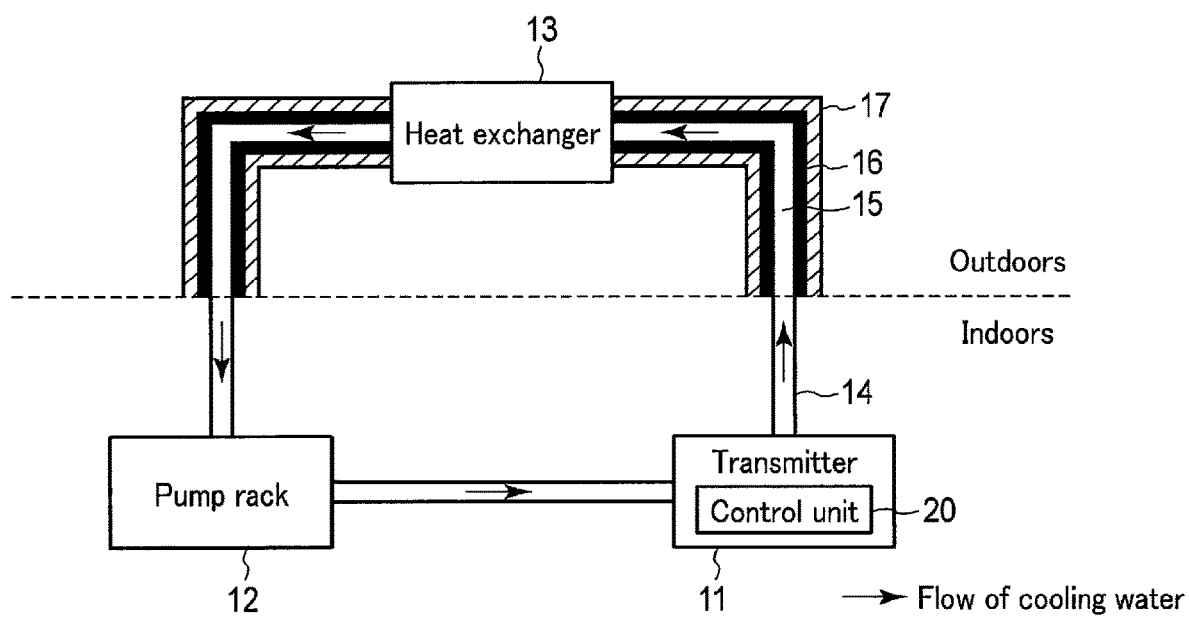
FIG. 7 is a block diagram illustrating an example of a transmission system according to a fourth embodiment.

FIG. 7 is a block diagram illustrating an example of a transmission system according to a fourth embodiment. Different points from FIG. 1 are that the tank 18 is removed, that the thermal storage medium 16 is attached to the surface of the outdoor piping 14, and that the heat insulator 17 is attached to the surface of the thermal storage medium 16.

[Operation]

The transmitter 11, pump rack 12, heat exchanger 13, piping 14 and cooling water 15 operate in the same manner as in the first embodiment. The thermal storage medium 16, which is attached to the outdoor piping 14, recovers, via the piping 14, the heat of the transmitter 11 which was taken in the cooling water 15. The thermal storage medium 16 changes from a solid to a liquid at a preset melting point, and stores the produced heat of the transmitter 11 as latent heat.

The latent heat radiated from the thermal storage medium 16 keeps the temperature of the cooling water 15 via the piping 14 and prevents a decrease in water temperature. If the transmitter 11 is reactivated from this state, the cooling water 15 begins to circulate. At this time, since the outdoor cooling water is in the state in which it is heated by the thermal storage medium 16, the occurrence of dew condensation and the occurrence of a heat shock can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A transmission system comprising:
    a transmitter configured to transmit radio waves for a television broadcast, the transmitter including an exothermic part which produces heat during an operation;
    a pump unit configured to circulate cooling water through the transmitter;
    a control unit configured to drive the pump unit, to circulate the cooling water while the transmitter is operating, and to stop the circulation of the cooling water at a time of a stop of the transmitter;
    an external piping configured to supply the cooling water, which was circulated through the transmitter, to the pump unit, the external piping being exposed to outdoors; and
    a thermal storage medium provided on a surface of the external piping, and configured to store waste heat of the exothermic part, which was taken in the cooling water via the external piping,
    wherein the control unit applies a voltage to the thermal storage medium, and heats the cooling water in the external piping by latent heat which occurs when the thermal storage medium changes in phase, and
    wherein, at the time of the stop of the transmitter, the control unit applies the voltage to the thermal storage medium, and the thermal storage medium is released from a supercooling state and radiates the waste heat while changing in phase from a liquid to a solid.

2. The transmission system of claim 1, wherein a material of the thermal storage medium is a material which radiates the latent heat in accordance with a solid-liquid phase change.

3. The transmission system of claim 2, wherein the material is an inorganic hydrate-based material.

4. The transmission system of claim 2, wherein the material is an organic substance-based material.

* * * * *